United States Patent [19]

Hanson et al.

[11] Patent Number: 5,950,066
[45] Date of Patent: Sep. 7, 1999

[54] SEMISOLID THERMAL INTERFACE WITH LOW FLOW RESISTANCE

[75] Inventors: Kevin L. Hanson, Bloomington; Mark Green, Eden Prairie, both of Minn.

[73] Assignee: The Bergquist Company, Edina, Minn.

[21] Appl. No.: 08/663,800

[22] Filed: Jun. 14, 1996

[51] Int. Cl.$^6$ ................................. H01B 3/02; H01B 3/46
[52] U.S. Cl. ........................ 428/551; 428/617; 428/620; 428/623; 428/626; 428/627; 524/404; 524/430; 524/443; 524/493; 524/496; 524/588; 252/75
[58] Field of Search ...................... 524/430, 404, 524/443, 493, 496, 588; 428/551, 617, 620, 623, 626, 627; 252/75

[56] References Cited

U.S. PATENT DOCUMENTS 3,882,033  5/1975  Wright ....................................... 252/75
4,265,775  5/1981  Aakalu ....................................... 252/75

*Primary Examiner*—Patricia A. Short
*Attorney, Agent, or Firm*—Haugen and Nikolai, P.A.

[57] ABSTRACT

An interface material for use in forming a coating interposed along a heat dissipating path between a solid state electronic device and a heat sinking surface. The coating consists of a formulation of a thermally stable wax which is formed as a polyorganosiloxane graft polymer of octadecene and a methylsiloxane host blended with a thermally conductive viscosity stabilizer consisting of a thermally conductive particulate material such as alumina, boron nitride, among others. The graft polymer, with its molecular weight of between approximately 10,000 and 15,000 has a density of between about 0.8 and 0.9 with a melting point of between about 30 degrees C. and 90 degrees C.

17 Claims, 3 Drawing Sheets

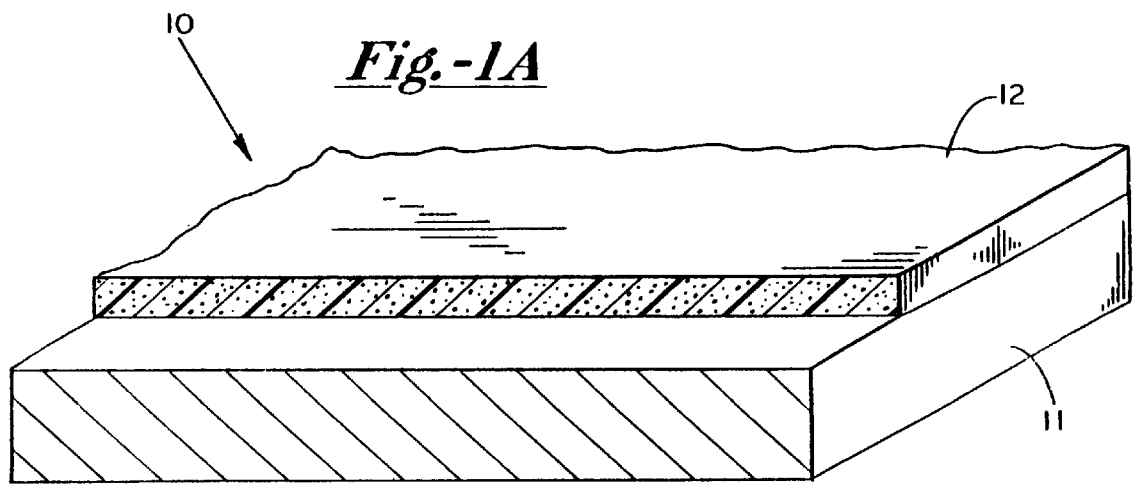
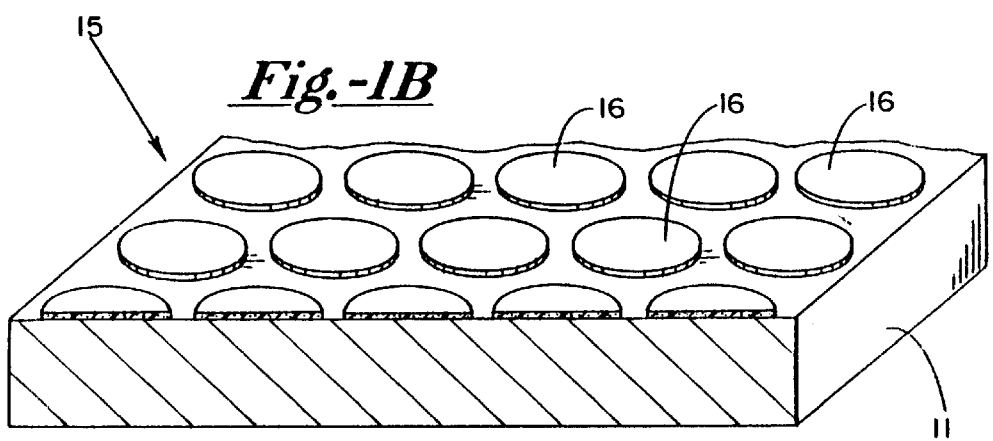

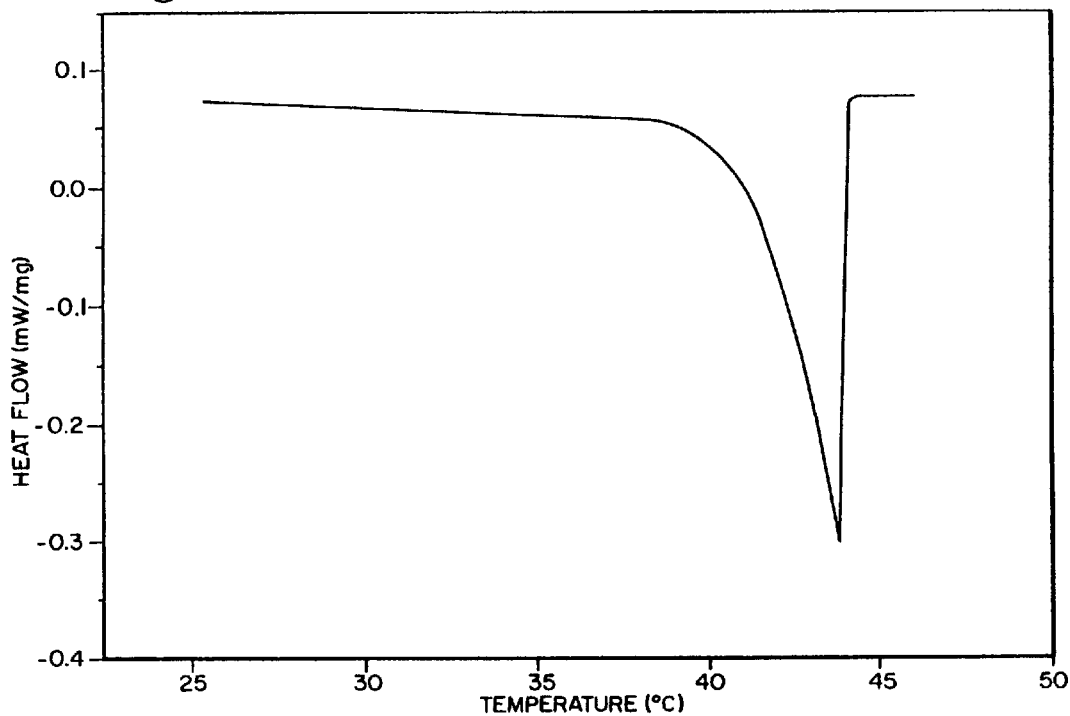
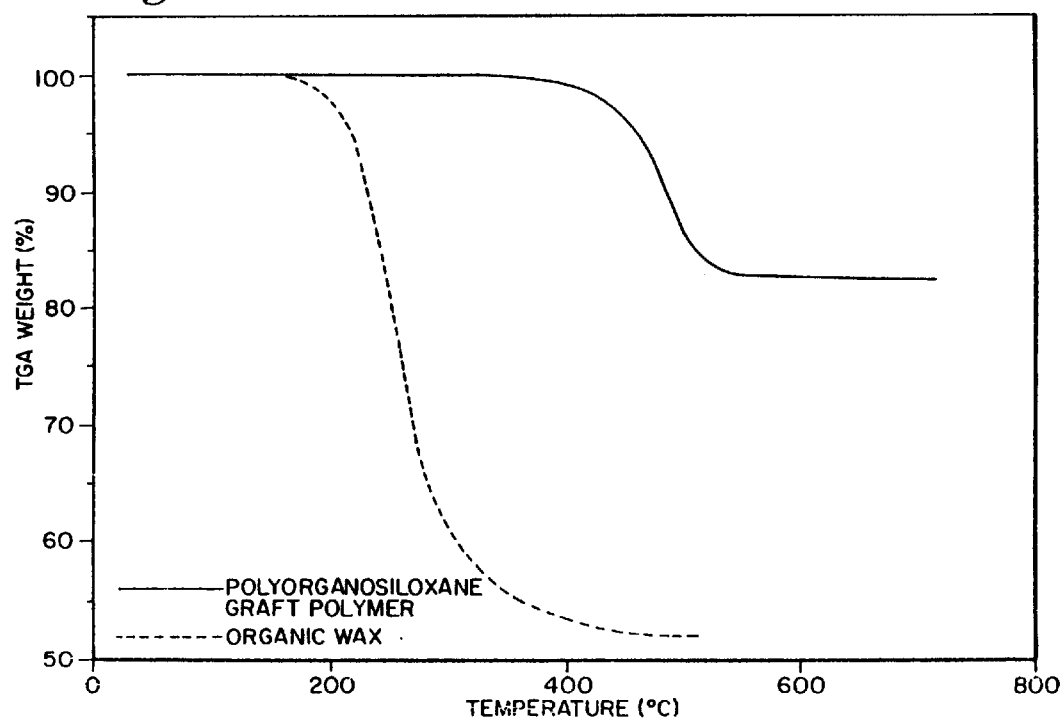

SEMISOLID THERMAL INTERFACE WITH LOW FLOW RESISTANCE

BACKGROUND OF THE INVENTION

The present invention relates generally to an interface coating for use in combination with solid state electronic components or devices, and more particularly to a semisolid interface coating which is adapted to be interposed along a heat dissipating path between a solid state electronic device and a mounting surface. The interface coating of the present invention comprises, in admixture, a polyorganosiloxane graft polymer with a methylsiloxane host together with a linear hydrocarbon having a single terminally positioned unsaturated linkage in the carbon chain, and with a chain length preferably between 16 and 19 carbon atoms. While other such linear hydrocarbons may be utilized, the graft polymer is advantageously prepared from octadecene and a methylsiloxane host, with the graft polymer thereafter being blended with a particulate solid. The particulate solid or filler functions as a thermally conductive component for the blend, and with its small particulate size and high surface area, functions also as a viscosity stabilizer for the polymer component. The polyorganosiloxane graft polymers utilized in the formulations of the present invention may have a melting point ranging from between about 30 degrees C. and 90 degrees C., and preferably having a melting point ranging from between about 30 degrees and 60 degrees C. The melting point range of an individual polymer is relatively narrow and sharply defined, thereby contributing to the consistency of performance.

The polyorganosiloxane graft polymer portion of the interface coating changes phase and becomes at least partially liquid during normal operation of the solid state electronic device with which it is operatively thermally coupled. The interface, when even only partially molten, provides a highly thermally conductive path substantially free of entrapped air so as to facilitate and enhance heat dissipation from the solid state device. The coatings of the present invention may be applied onto the surfaces upon which the solid state electronic device is either being directly mounted, or alternatively, to which the device is being operatively thermally coupled. The coatings of the present invention may be applied as required onto either surfaces of metallic or polymeric materials. These coatings may be applied as continuous layers or may be applied on an intermittent or segmented pattern basis in the form of strips or dots. The coatings may also be die cut and applied to the appropriate surface.

Solid state electronic devices or components are in wide use and application, being incorporated in electronic systems generally, including systems used in the fields of data processing, communications, power supply systems, among others. Solid state electronic devices including power transistors, power modules including converters such as AC-to-DC and DC-to-DC and other similar components. The term "solid state electronic devices" is being used herein in a comprehensive sense, and is intended to include solid state circuits wherein a complete circuit is formed from a single block or chip of semiconductor material, solid state circuit elements such as Zener diodes, silicone controlled rectifiers, as well as other solid state components such as transistors and diodes. Other devices falling within the comprehensive meaning of the term includes passive components, thermoelectric devices, as well as lasers, each of which typically require contact with a heat exchanger or a thermally conductive path for heat dissipation. These devices are typically incorporated in packages designed for mounting on a chassis in accordance with the individual requirements of the specific circuit. As power and frequency requirements increase, and as the space available for these devices or components shrink, these packages typically require highly efficient, effective, and reliable means for dissipating heat created by the solid state electronic devices during periods of normal operation, with the heat typically being transferred by thermal conduction from the package to a mounting surface. This thermal conduction may be undertaken either directly, as occurs when the device is mounted upon the heat dissipating surface, or indirectly as occurs when the device is mounted to a surface which is arranged along a thermal path to a heat dissipating member.

In the past, during assembly, it has been common to apply a layer of grease, typically a silicone grease, or a layer of an organic wax to aid in creating a low thermal resistance path between the opposed mating surfaces of the package and the mounting surface. A layer of such grease is typically applied between these mating surfaces in order to facilitate and enhance thermal conductivity. In certain applications, heat spreaders may be employed along the thermal path to achieve certain heat dissipating objectives, and the interface coatings of the present invention may be employed along the surfaces of heat spreaders as well. In each of these instances, the quantity of entrained air is reduced and thermal conductivity is improved in order to increase thermal energy flow from the electronic device.

In the course of a typical assembly operation prior to the present invention, silicone grease, for example, was applied liberally to the surfaces so as to assure its presence in all of those locations where it is reasonably expected to be needed or required. As a result, the assembly operations utilizing grease typically over-apply the material, and the products become messy, with the grease in certain instances, interfering with subsequent assembly operations and also with subsequent operation of the solid state device. Under application has also presented some problems, particularly regarding consistency. The features of the present invention provide a highly thermally conductive coating which may be applied to surfaces along a thermal path, with the coating having a consistent and uniform thickness which contributes to consistency in performance. Given this property in the thermally conductive coating, greater predictability of performance is available from the semiconductor devices utilized in combination with the coating, with these advantages being obtained without experiencing the problems inherent in applications of silicone grease.

SUMMARY OF THE INVENTION

In accordance with the present invention, therefore, an interface for mounting solid state electronic devices is provided in the form of a material in dry film coating form with the coating functioning to enhance thermal transfer from the device or its heat sink to a chassis or the like. The dry film coating form provides advantages over the normally employed grease form. When employed in an actual circuit arrangement, assembly time is shortened, the operation is rendered clean, with ease of application and assembly being provided along with improvements in stability of operation. During normal operation of the solid state electronic devices, the polyorganosiloxane graft polymer becomes molten, thereby enhancing the ability of the interface to effectively transfer thermal energy from the device to its mounting chassis. In addition to being highly thermally conductive, the interface coatings of the present invention also provide for high conformability and flow in response to application of exceptionally low forces and resultant low unit forces and pressures. Interfaces of the present invention may be employed wherever typical solid state electronic mounting packages are utilized. Because of their property of low resistance to flow, the interfaces are highly useful and effective when the nature of the package permits only extremely small external forces to be utilized. Some of these products typically tolerate only low or modest forces and/or unit pressures during application of the normally encountered mounting forces, and the coatings of the present invention will flow to conform to the configuration of the surfaces involved. In addition, the formulation of the present invention provide a coating in dry film form wherein a significant portion of the polyorganosiloxane component of the formulation is solid at normal room temperatures, but becomes molten or otherwise undergoes a change of phase from solid to liquid at a low temperature such as between about 30 degrees C. and 90 degrees C., and preferably between about 30 degrees C. and 60 degrees C. In one preferred embodiment, a melting range of between about 40 degrees C. and 45 degrees C. is achieved. When undergoing a change of phase, the interface accommodates and conforms to the configurations of the opposed surfaces with which it is in contact, thereby increasing the area of contact between the interfaces and eliminating air, and thus increasing the rate of thermal transfer through conduction from the heat generating solid state electronic device to its mounting surface.

Briefly, the interface material of the present invention comprises a polyorganosiloxane graft polymer of a methylsiloxane host and a linear hydrocarbon of from 16 up to about 19 carbon atoms with a single terminally positioned unsaturated linkage present in its carbon chain. One such linear hydrocarbon is 1-octadecene. Suitable linear hydrocarbons are represented by the structural formula:

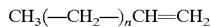

wherein "n" is an integer ranging from between 13 and 17. The graft polymer is in admixture with a thermally conductive viscosity stabilizer in particulate form. To prepare the graft polymer, 1-octadecene, for example, is grafted onto the polyorganosiloxane through a vinyl addition reaction. The resultant wax product is treated for removal of organic volatiles and/or hydrocarbons through stripping, with this operation also achieving separation and removal of residual stearyl components. Those reactant products falling within the density range of between about 0.8 and 0.9 and a preferred melting point range between 40 degrees C. and 45 degrees C. have a preferred average molecular weight of approximately 12,000. For most applications, reactant products having an average molecular weight of between about 10,000 and 20,000 are useful, with average molecular weights ranging up to about 200,000 being acceptable in certain situations. For example, these higher molecular weight products may be employed wherever the application permits use of a coating with high viscosity at a low shear rate.

Reactant products useful in accordance with the present invention are semisolid waxy materials at normal ambient conditions, and remain so when the graft polymer component is blended with particulate solids in the range set forth. The resultant composition or product is conveniently formed as a dry cohesive coating. The coating is highly compliant with a low resistance to flow. Compositions with a melting point ranging from between about 30 degrees C. and 90 degrees C. are useful, and those with a melting point of below about 60 degrees C. are generally preferred. The graft polymer is treated to remove impurities or unreacted components so as to yield a substantially purified reactant product with a relatively narrow and sharply defined melting point. The particulate viscosity stabilizer is preferably highly thermally conductive, and is generally selected from the group consisting of alumina, boron nitride, graphite, silicon carbide, diamond, metal powders as well as mixtures thereof.

The interface material of the present invention preferably contains from between about 15% and 25% by weight polyorganosiloxane graft polymer, balance thermally conductive viscosity stabilizer in particulate form. A preferred formulation range is between 20% and 25% by weight graft polymer, balance thermally conductive viscosity stabilizing particulate. Preferably, and for most applications, the average particle size of the viscosity stabilizer is less than about 25 microns, it being noted that fillers having small particle size and high surface area are generally preferred. Graft polymers of octadecene and methylsiloxane are commercially available, as are the various particulate solids including alumina, boron nitride, graphite, diamond, metal powder, and silicon carbide.

Therefore, it is a primary object of the present invention to provide an improved thermally conductive high flow interface coating in dry film form to function as a thermal interfacing material within the heat dissipating path between a solid state electronic device and a mounting surface.

It is a further object of the present invention to provide an improved interface material arranged to be applied to a solid state electronic device or heat sink as a film or coating, and wherein the interface material comprises a polyorganosiloxane graft polymer of octadecene and a methylsiloxane host in admixture with a thermally conductive viscosity stabilizer.

It is yet a further object of the present invention to provide an improved interface material for interposition within the heat dissipating path between a solid state electronic device and a mounting surface, and wherein the interface material comprises a blend of polyorganosiloxane graft polymer of octadecene and a methylsiloxane host, with the graft polymer having a melting point of between about 30 degrees C. and 90 degrees C., preferably between 30 degrees C. and 60 degrees C. and with an average molecular weight of between approximately 10,000 and 20,000.

Other and further objects of the present invention will become apparent to those skilled in the art upon a study of the following specification, appended claims, and accompanying drawings.

IN THE DRAWINGS

FIG. 1A is a perspective view, partially in section, illustrating a typical interface pad prepared in accordance with the present invention and being in a continuous coating form;

FIG. 1B is a perspective view similar to that of FIG. 1A, and illustrating the interface pad in an alternate configuration or form, specifically a reticulated geometric shape pattern such as a dot pattern;

FIG. 2 is a plot of a curve representing the melting point range versus temperature for the preferred polyorganosiloxane graft polymer utilized in connection with the present invention, the curve being generated by using differential scanning calorimetry;

FIG. 3 is a curve representing the comparative weight loss for polyorganosiloxane graft polymers used in connection with the present invention and a common organic wax;

Figure 4:
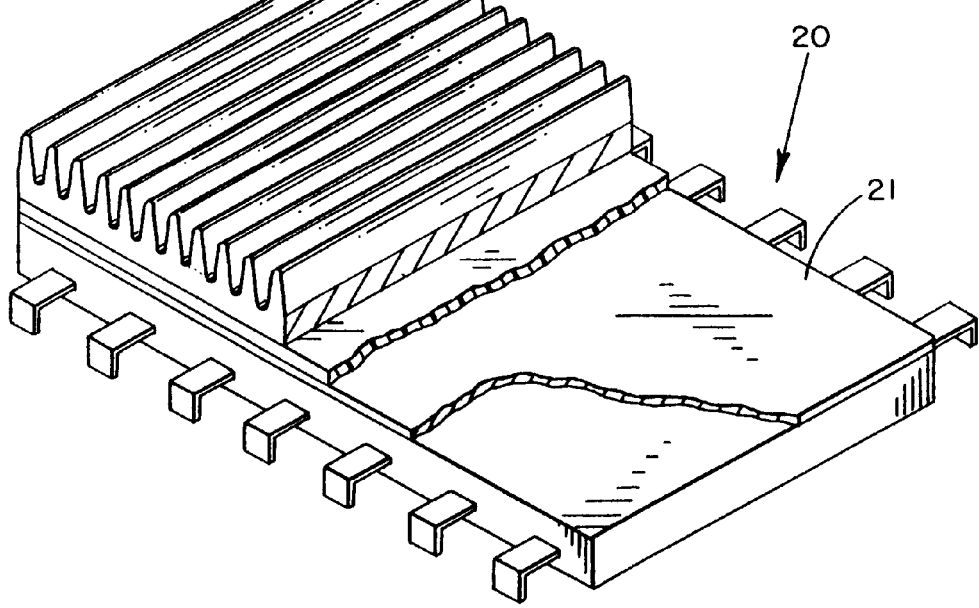
Figure 5:
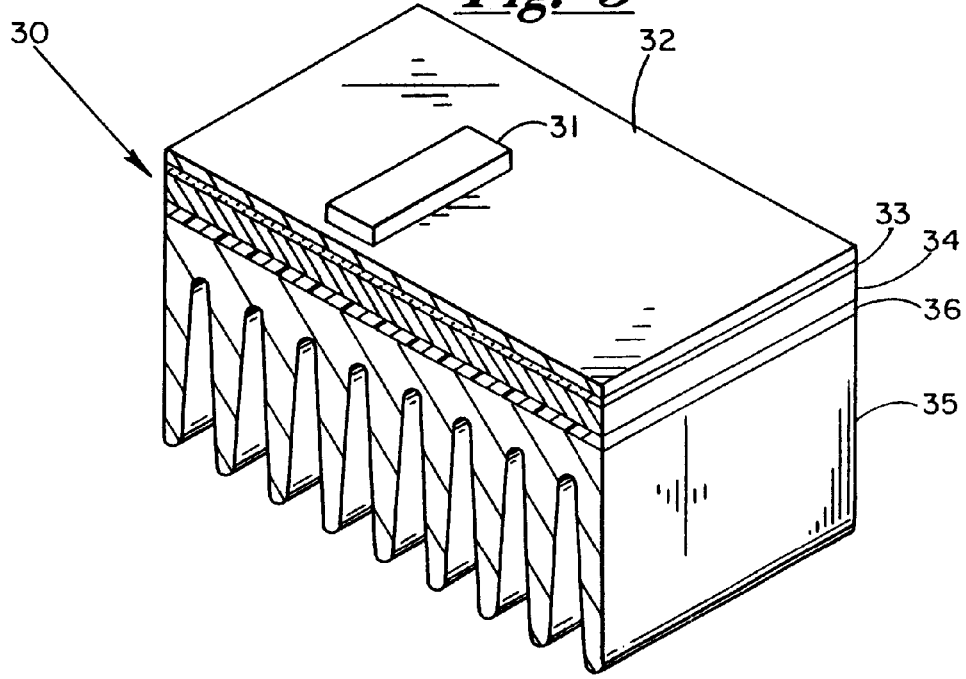

FIG. 4 is a perspective view of a packaged solid state electronic device having a coating applied to a surface thereof to facilitate the formation of a thermally conductive path from the package to a metallic heat dissipating member or heat sink, with a portion of the coating being cut-away and illustrated in section; and FIG. 5 is a perspective view of a packaged solid state electronic device mounted directly onto a circuit board which comprises one portion of a thermal path leading to a heat sink, wherein a heat spreader is positioned at an intermediate point along the path, wherein the coating of the present invention is interposed between the surfaces of the heat spreader and heat sink.

DESCRIPTION OF THE PREFERRED EMBODIMENT

In accordance with the present invention, a polyorganosiloxane graft polymer of octadecene on a methylsiloxane host was prepared in accordance with the procedure of Synthesis I below:

SYNTHESIS I

In order to prepare the polyorganosiloxane graft polymer, the following operations were conducted.

To prepare the silicone wax component, a reactant mixture was prepared utilizing 1-octadecene, $CH_3(CH_2)_{15}CH=CH_2$, with polyhydromethylsiloxane:

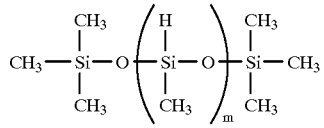

wherein "m" is an integer having a value of between 38 and 40, in the presence of a platinum catalyst. The reaction was undertaken at 100 degrees C. at ambient pressure, and continued for 30 minutes for a batch size of 30 grams. The melting point of the reactant product was 43.8 degrees C. The melting point is subject to adjustment as desired by changing either the organic group or the silicone/organic content ratio.

Other organic groups which may be utilized in lieu of 1-octadecene include, 1-hexadecene, 1-heptadecene, 1-nonadecene, or like materials. As indicated hereinabove, the organic group is a linear hydrocarbon with a single terminally positioned unsaturated linkage in its carbon chain, represented by the structural formula:

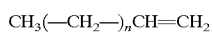

wherein "n" is an integer having a value ranging from between 13 and 17. Such linear hydrocarbons are, of course, commercially available, including, in particular, 1-octadecene, it being noted that 1-heptadecene, 1-nonadecene and eicosene may also be employed. These linear hydrocarbons are all commercially available.

The silicone/organic content may also be adjusted by utilizing hydromethylsiloxane-dimethylsiloxane copolymers such as:

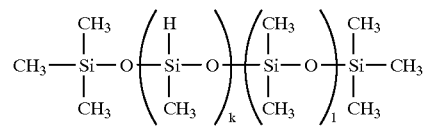

wherein "k" and "l" are integers wherein "k" has a value ranging from 19 to 39, and wherein "l" has a value equal to the remainder of (40–k).

By way of further example, when the siloxane component employs higher quantities of the methylsiloxane radical, it has been found that the melting point drops below acceptable levels. In this connection, when the percentage of the methylsiloxane component exceeds about 50% by weight, the melting point falls below about 30 degrees C. Thus, the reason for the utilization of the material described hereinabove.

Upon completion of the above described synthesis reaction, the reactant product was further treated through a stripping operation to separate the graft polymer from solvents as well as non-reacted materials. This stripping operation was undertaken at 99 degrees C. at a pressure of 0.2 Torr until the volatiles are substantially removed. Such separation techniques are, of course, known by those skilled in the art.

Certain other silicone-organic polymers may be utilized in formation of the polyorganosiloxane graft polymer. For example, polydiethylsiloxane may be employed as well as certain aryl alkyl siloxanes such as phenylmethylsiloxane. In certain instances, halogenated alkyl siloxanes such as trifluoropropylsiloxane may be found suitable in certain applications as well.

SYNTHESIS II

In order to prepare an alternative polyorganosiloxane graft polymer, the following operations were conducted.

To prepare the silicone wax component, a reactant mixture was prepared utilizing 1-heptadecene, $CH_3(CH_2)_{14}CH=CH_2$ with polyhydromethylsiloxane of the following structural formula:

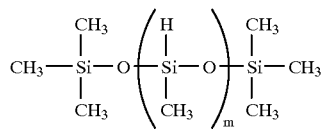

wherein "m" is an integer having a value of between 38 and 40, in the presence of a platinum catalyst. The reaction was undertaken at 100 degrees C. at ambient pressure, and continued for 30 minutes for a batch size of 30 grams. The melting point of the reactant product was 35 degrees C., this melting point being subject to adjustment as desired by changing the silicone/organic content ratio.

SYNTHESIS III

In order to prepare an alternative polyorganosiloxane graft polymer, the following operations were conducted.

To prepare the silicone wax component, a reactant mixture was prepared utilizing 1-nonadecene, $CH_3(CH_2)_{16}CH=CH_2$ with polyhydromethylsiloxane of the following structural formula:

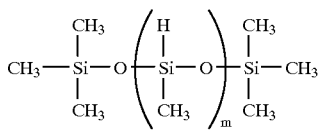

wherein "m" is an integer having a value of between 38 and 40, in the presence of a platinum catalyst. The reaction was undertaken at 100 degrees C. at ambient pressure, and continued for 30 minutes for a batch size of 30 grams. The melting point of the reactant product was 55 degrees C., this melting point being subject to adjustment as desired by changing the silicone/organic content ratio.

SYNTHESIS IV

In order to prepare an alternative polyorganosiloxane graft polymer, the following operations were conducted.

To prepare the silicone wax component, a reactant mixture was prepared utilizing 1-eicosene, $CH_3(CH_2)_{17}CH=CH_2$ with polyhydromethylsiloxane of the following structural formula:

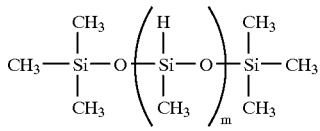

wherein "m" is an integer having a value of between 38 and 40, in the presence of a platinum catalyst. The reaction was undertaken at 100 degrees C. at ambient pressure, and continued for 30 minutes for a batch size of 30 grams. The melting point of the reactant product was 65 degrees C., this melting point being subject to adjustment as desired by changing the silicone/organic content ratio.

In order to prepare interface materials in accordance with the present invention, the information contained in the following section on General Formulation is informative.

GENERAL FORMULATION

By way of a general formulation, the following is typical:

| Component | Parts by Weight |
| --- | --- |
| Polyorganosiloxane graft polymer of Synthesis I | 100 |
| Viscosity control particulate | 200–350. |

At low levels or concentrations of viscosity control particulate, the viscosity of the resultant product is too low and the material may run, sag, and/or drip. When the particulate is incorporated above 350 parts per hundred weight resin (PHR), the viscosity becomes excessive and the flow resistance increases, particularly when employed at exceptionally low and/or modest mounting pressures while at the same time it remains necessary to force or exclude entrapped air out of the interface zone. When air becomes entrapped along the thermal path, an increase in thermal resistance and a resultant decrease in performance of the solid state device occurs. In certain instances, reactant products with high viscosity coupled with low shear may be employed. In such instances, because of the small particulate size together with the high surface area it offers, when pressure is applied with a shear force during assembly, thixotropic flow occurs. Such thixotropic behavior renders certain of the higher molecular weight materials suitable.

By way of further example, Table I below indicates the change in thermal resistance versus filler in PHR:

TABLE I

| Alumina PHR | Thermal Test Die $\theta cS°$ C./watt |
| --- | --- |
| 200 | 0.2 |
| 250 | 0.2 |
| 300 | 0.2 |
| 400 | 0.5 |
| 500 | 0.8. |

The alumina content must be present in the ranges specified herein, since when the alumina content is too high, the ability to flow is sacrificed. When too low, flow may become excessive. In the thermal test indicated above, the test employed is known in the art as the Pentium Test.

In order to formulate specific materials, the following examples are provided:

EXAMPLE I

One hundred parts of polyorganosiloxane graft polymer prepared in accordance with the General Formulation hereinabove was blended with 350 parts of alumina powder having an average particle size of about 3 microns, and with a particle size ranging from between about 1 micron and 10 microns. Such alumina particulate is commercially available.

The resultant material was a dry film having a melting point of 43 degrees C., and was capable of being handled and/or coated for use as an interface in the thermal path between a solid state electronic device package and a chassis. The thermal resistance was measured pursuant to test method of Table I and found to be 0.2° C./watt.

EXAMPLE II

The polyorganosiloxane graft polymer of Example I was blended with 400 parts of alumina powder having an average particle size of about 3 microns, and with a particle size ranging from between 1 micron and 10 microns. Such alumina particulate is commercially available.

The resultant material was a dry film or coating having a melting point of 43 degrees C., and was capable of being handled and/or cut into strips for use as an interface between a solid state electronic device package and a chassis. The thermal resistance was measured pursuant to the method of Table I and found to be 0.5° C./watt.

The dielectric constant of the resultant products from Examples I and II was measured and found to be 5 at 1 kHz, with the volume resistivity being $10^{10}$ ohm-meters.

Certain polyorganosiloxane graft polymers are commercially available from a variety of sources. When a commercially available graft polymer having either unreacted or stray components present, it may be helpful to treat the material to reduce or eliminate the presence of unreacted components or impurities. Treatment in a vacuum still may be found helpful for removal of certain unreacted components and/or impurities.

OPERATION OF THE INVENTION

With attention now being directed to FIG. 1A, a mounting surface or chassis generally designated 10 includes a metallic support plate 11 functioning as a heat spreader or heat sink and upon which an interface coating 12 has been applied. As is apparent, the coating is substantially continuous and is arranged and designed for placement of a solid state electronic device upon the upper surface of the coating.

With attention being directed to FIG. 1B, the partial assembly generally designated 15 includes, as was present in FIG. 1A, a metallic support plate 11 upon which is disposed a geometric pattern, including the pattern of dots, such as dots 16—16 in a reticulated coating arrangement. Specifically, one arrangement of reticulated dots which has been found useful employs dots formed of the composition of the present invention having a diameter of 120 mils, with the dots being arranged on 150-mil centers. The dots may typically have a thickness of between 2 mils and 6 mils, although other thicknesses and physical patterns may be employed as well.

With attention now being directed to FIG. 4, a packaged solid state electronic device generally designated 20 is illustrated having an interface coating 21 applied to an outer major surface thereof. The coating 21 is both adherent and coherent, and is formulated in accordance with the present invention. Depending upon the configuration and/or geometry of the circuit in which the packaged solid state electronic device is inserted, the coating 21 may provide an interface directly between the device and a heat sink, or alternatively between the device and a heat spreader. See, for example, the arrangement in the configuration set forth in FIG. 5.

With attention being directed to the alternate arrangement of FIG. 5, it will observed at the assembly generally designated 30 comprises a power device 31 arranged at the upper surface of conductive circuit layer 32, with dielectic layer 33 supporting conductive layer 32. A metal heat spreader is interposed along the thermal path as at 34, with the thermal path ultimately leading to heat sink 35. The coating material of the present invention is shown at 36, interposed between the surfaces of heat spreader 34 and heat sink 35. In this arrangement, the thermal energy from power device 31, along with any other power devices positioned along the surface of conductive layer 32, will dissipate heat along the thermal path leading to and terminating with heat sink 35. For most purposes, dielectic layer 33 is fabricated from a suitable thermally conducting dielectic, such as, for example, any of the well-known thermally conductive ceramic dialectics.

FIG. 2 is a plot demonstrating the thermal ramp plot of temperature in degrees C. versus heat flow in milliwatts per milligram, and demonstrating the melting characteristics of a polyorganosiloxane graft polymer prepared in accordance with the present invention. The plot demonstrates that a substantially completely molten state is achieved at about 46 degrees C.

FIG. 3 is a graph illustrating a comparison between the weight loss in percent of a polyorganosiloxane graft polymer prepared in accordance with the present invention compared with an organic wax of the type typically employed in mounting of solid state electronic semiconductor devices. The plot or graph illustrates the weight loss achieved at various temperatures shown in degrees C.

Of particular interest in connection with the present invention is the estimated lifetime of the material at various temperatures, along with a comparison of the estimated lifetime of the polyorganosiloxane graft polymer of the present invention with a commercially-available organic wax of the type utilized in mounting of solid state electronic semiconductor devices.

Table II below represents the performance of an interface coating prepared in accordance with the present invention upon exposure to elevated temperatures for extended periods of time, with the lifetime in hours being determined upon the determination of a 1% weight loss.

A reactant mixture for the creation of a polyorganosiloxane graft polymer reactant product was prepared in accordance with Example II and applied as a coating on the surface of an aluminum plate, with the coating having a thickness of 5 mils. Standard kinetics analysis of thermal weight loss data with the analysis being undertaken utilizing standardized kinetics of thermal weight loss data from thermal gravimetric analysis of the type shown in FIG. 3, and showing that the organic wax thermally decomposes at a lower temperature than the graft polymer. In order to evaluate performance, three different ramp rates were employed varying from between 5 degrees C. per minute to 20 degrees C. per minute, with the specific rates being 5 degrees C. per minute, 10 degrees C. per minute, and 20 degrees C. per minute. The performance of this material when subjected to elevated temperatures is set forth in Table II below:

TABLE II

| ESTIMATED LIFETIME vs. TEMPERATURE | |
| --- | --- |
| Temperature °C. | Lifetime Hour based on 1% weight loss |
| 50.0 | 1.57E + 14 |
| 100.0 | 7.66E + 9 |
| 150.0 | 3.91E + 6 |
| 200.0 | 9920. |

A comparison was undertaken with an organic wax of the type commonly used as an interface for solid state electronic devices, with the material being applied as a coating on an aluminum plate, the coating having a thickness of 5 mils. In order to evaluate performance, three different ramp rates were employed varying from between 5 degrees C. per minute to 20 degrees C. per minute, with the specific rates being 5 degrees C. per minute, 10 degrees C. per minute, and 20 degrees C. per minute. The thermal performance indicating the estimated lifetime versus temperature is set forth in Table III below:

TABLE III

| ESTIMATED LIFETIME vs. TEMPERATURE | |
| --- | --- |
| Temperature °C. | Lifetime Hour based on 1% weight loss |
| 50.0 | 0.461 |
| 100.0 | 0.199 |
| 150.0 | 0.105 |
| 200.0 | 0.0633. |

The stability of the material of the present invention is believed to be demonstrated by the data contained in Tables II and III herein. When the product is to be applied for use in an oxidative atmosphere or environment, thermal stability may be enhanced through the use of an antioxidant such as tetrakis [methylene (3,5-di-tert-butyl-4 hydroxyhydrocinnamate)]. Such antioxidants are commercially available under the code designation "Irganox 1010" from Ciba Geigy Corp. of Ardsley, N.Y.

It will be appreciated that the examples provided hereinabove are illustrative only and are not to be regarded as a limitation upon the scope of the following appended claims.

What is claimed is:

1. An interface material for interposition along a heat dissipating path between a solid state electronic device and a heat sinking surface and comprising:
   (a) a thermal interface material including a blend of a thermally conductive particulate solid viscosity stabilizer and a polyorganosiloxane graft polymer, said graft polymer consisting of a methylsiloxane host and a linear hydrocarbon with the linear hydrocarbon component of the graft polymer having a single terminally positioned unsaturated linkage and represented by the structural formula:

$$CH_3(-CH_2-)_n CH=CH_2$$

wherein "n" is an integer ranging from between 13 and 16, the graft polymer forming a thermally stable wax and having a melting point of between about 30 degrees C. and 90 degrees C. and a number average molecular weight of between approximately 10,000 and 20,000, and being substantially free of solvents; and
   (b) said thermally conductive particulate solid viscosity stabilizer blended with said polyorganosiloxane graft polymer being selected from the group consisting of alumina, boron nitride, graphite, silicon carbide, diamond, metal powders, and mixtures thereof, with the viscosity stabilizer having an average particle size of less than about 25 microns, and with the thermal interface material containing from between about 15% and 25% polyorganosiloxane graft polymer and with the balance of from 75% to 85% being thermally conductive viscosity stabilizer.

2. The interface material of claim 1 being particularly characterized in that the graft polymer has a melting point between 30 and 60 degrees C.

3. The interface material of claim 1 being particularly characterized in that the thermally stable wax has a density of between 0.8 and 0.9.

4. The interface material of claim 1 being particularly characterized in that the linear hydrocarbon component of the polyorganosiloxane graft polymer is octadecene and the said graft polymer incorporating octadecene has a number average molecular weight of between about 11,500 and 12,500.

5. The interface material of claim 1 being particularly characterized in that the linear hydrocarbon component is 1-octadecene.

6. The interface material of claim 5 being particularly characterized in that the polyoraanosiloxane graft polymer forming said thermally stable wax has a number average molecular weight of between about 11,500 and 12,500.

7. In combination: a solid state electronic device and a thermally conductive coating arranged along a thermal path extending from at least one surface of the solid state electronic device to a heat sink, the thermal path including a compliant interface pad for establishing at least a portion of the thermally conductive path between the solid state electronic device and the heat sink, the compliant interface pad being particularly characterized in that it consists of:
   (a) a thermally stable polyorganosiloxane graft polymer consisting of a methylsiloxane host and a linear hydrocarbon, with the linear hydrocarbon having a single terminally positioned unsaturated linkage and represented by the structural formula:

$$CH_3(-CH_2-)_n CH=CH_2$$

wherein "n" is an integer ranging from between 13 and 16, with the graft polymer forming a thermally stable wax and having a melting point of between about 30 degrees C. and 90 degrees C. and having a number average molecular weight of between approximately 10,000 and 20,000 and being substantially free of solvents; and
   (b) a thermally conductive particulate solid viscosity stabilizer blended with said graft polymer and being selected from the group consisting of alumina, boron nitride, graphite, silicon carbide, diamond, metal powders, and mixtures thereof, with the said viscosity stabilizer having an average particle size of less than about 25 microns, and with the compliant interface pad consisting of from between about 15% and 25% of said thermally stable polyorganosiloxane graft polymer, with the balance of from 75% to 85% being thermally conductive viscosity stabilizer.

8. The combination of claim 7 being particularly characterized in that the graft polymer has a melting point between 40 and 45 degrees C.

9. The combination of claim 7 being particularly characterized in that the linear hydrocarbon component of the thermally stable graft polymer is octadecene and the thermally stable graft polymer has a number average molecular weight of between 11,500 and 12,500.

10. The interface material of claim 7 being particularly characterized in that the thermally stable wax has a density of between 0.8 and 0.9.

11. The interface material of claim 7 being particularly characterized in that the linear hydrocarbon component is 1-octadecene.

12. The interface material of claim 11 being particularly characterized in that the said graft polymer has a number average molecular weight of between about 11,500 and 12,500.

13. In combination, a heat spreader device in the form of a thermally conductive metallic pad interposed along a thermal path between a packaged solid state electronic device and a heat sink, and with the heat spreader having a thermally conductive coating arranged along at least one surface thereof and forming a compliant interface pad for establishing a thermally conductive path between the packaged solid state electronic device and a heat sink, the compliant interface pad consisting essentially of:
   (a) a thermally stable polyorganosiloxane graft polymer of a methylsiloxane host and a linear hydrocarbon, with the linear hydrocarbon having a single terminally positioned unsaturated linkage and represented by the structural formula:

$$CH_3(-CH_2-)_n CH=CH_2$$

wherein "n" is an integer ranging from between 13 and 16, the graft polymer forming a thermally stable wax and having a melting point of between about 30 degrees C. and 90 degrees C. and a number average molecular weight of between approximately 10,000 and 20,000 and being substantially free of solvents; and
   (b) a thermally conductive particulate solid viscosity stabilizer selected from the group consisting of alumina, boron nitride, graphite, silicon carbide, diamond, metal powders, and mixtures thereof, with the viscosity stabilizer having an average particle size of less than about 25 microns, and with the interface material containing from between about 15% and 25% of said thermally stable polyorganosiloxane graft polymer, with the balance of from 75% to 85% being thermally conductive viscosity stabilizer.

14. The interface material of claim 13 being particularly characterized in that the graft polymer has a melting point between 40 and 45 degrees C.

15. The interface material of claim 13 being particularly characterized in that the linear hydrocarbon component of the thermally stable graft polymer is octadecene and said graft polymer having a number average molecular weight of between about 11,500 and 12,500.

16. The interface material of claim 13 being particularly characterized in that the linear hydrocarbon component is 1-octadecene.

17. The interface material of claim 13 being particularly characterized in that the thermally stable wax has a density of between 0.8 and 0.9.

* * * * *